United States Patent [19]

Owsley et al.

[11] Patent Number: 5,694,125
[45] Date of Patent: Dec. 2, 1997

[54] SLIDING WINDOW WITH BIG GAP DATA COMPRESSION SYSTEM

[75] Inventors: Patrick A. Owsley, Moscow; Kenneth J. Baker, Meridian; Catherine A. French, Moscow, all of Id.; Greg C. Zweigle, Pullman, Wash.

[73] Assignee: Advance Hardware Architecture, Pullman, Wash.

[21] Appl. No.: 510,148

[22] Filed: Aug. 2, 1995

[51] Int. Cl.$^6$ ............................... H03M 7/40; G11C 7/00
[52] U.S. Cl. .................. 341/50; 382/232; 358/261.2; 341/67
[58] Field of Search ............... 341/50, 51, 106, 341/67; 358/430, 261.4, 261.2; 382/238, 239, 232, 243

[56] References Cited

U.S. PATENT DOCUMENTS

| | | | |
|---|---|---|---|
| 5,010,345 | 4/1991 | Nagy | 341/65 |
| 5,473,326 | 12/1995 | Harrington et al. | 341/51 |
| 5,565,383 | 10/1996 | Adams et al. | 365/201 |

OTHER PUBLICATIONS

Rice, Robert F., Yeh, Pen-Shu, Miller, Warner. "Algorithms for a Very High Speed Universal Noisless Coding Module," JPL Publication 91-1, NASA, Feb. 15, 1991.

Storer, James A., ed. *Image and Text Compression*, Klumer Academic Publishers, Boston. 1992. ISBN 0-7923-9243-4.

Wallace, Gregory K. "The JPEG Still Picture Compression Standard," Communications of the ACM, Apr. 1991, vol. 34, No. 4. pp. 31-44.

Witten, Ian H., Moffat, Alistair, Bell, Timothy C. *Managing Gigabytes: Compressing and Indexing Documents and Images*. Van Nostrand Reinhold, New York, 1994. ISBN 0-442-01863-0.

*Primary Examiner*—Jeffrey A. Gaffin
*Assistant Examiner*—Peguy Jean Pierre
*Attorney, Agent, or Firm*—Haverstock & Associates

[57] ABSTRACT

A sliding window with big gap data compression system is simple to implement and gives good compression over a wide variety of bilevel images. A sliding window compressor with a very small window size is utilized in conjunction with a storage buffer which is large enough to hold at least an entire scan line of data symbols. Coupled to the storage buffer is circuitry that checks for a match between the incoming data symbol and a symbol stored in one specific programmable location. This programmable location is preferably exactly one scan line length away. Match locations are either within the range of the small window or exactly equal to the specific programmable location. The entire compressor can be viewed as a sliding window with a big gap (SWBG). This sliding window is of a length corresponding to the length of the scan line, comprised of the small window followed by a big gap and then the one specific programmable location, at the end of the scan line.

38 Claims, 11 Drawing Sheets

Block diagram of actual implementation of sliding window with big gap compressor

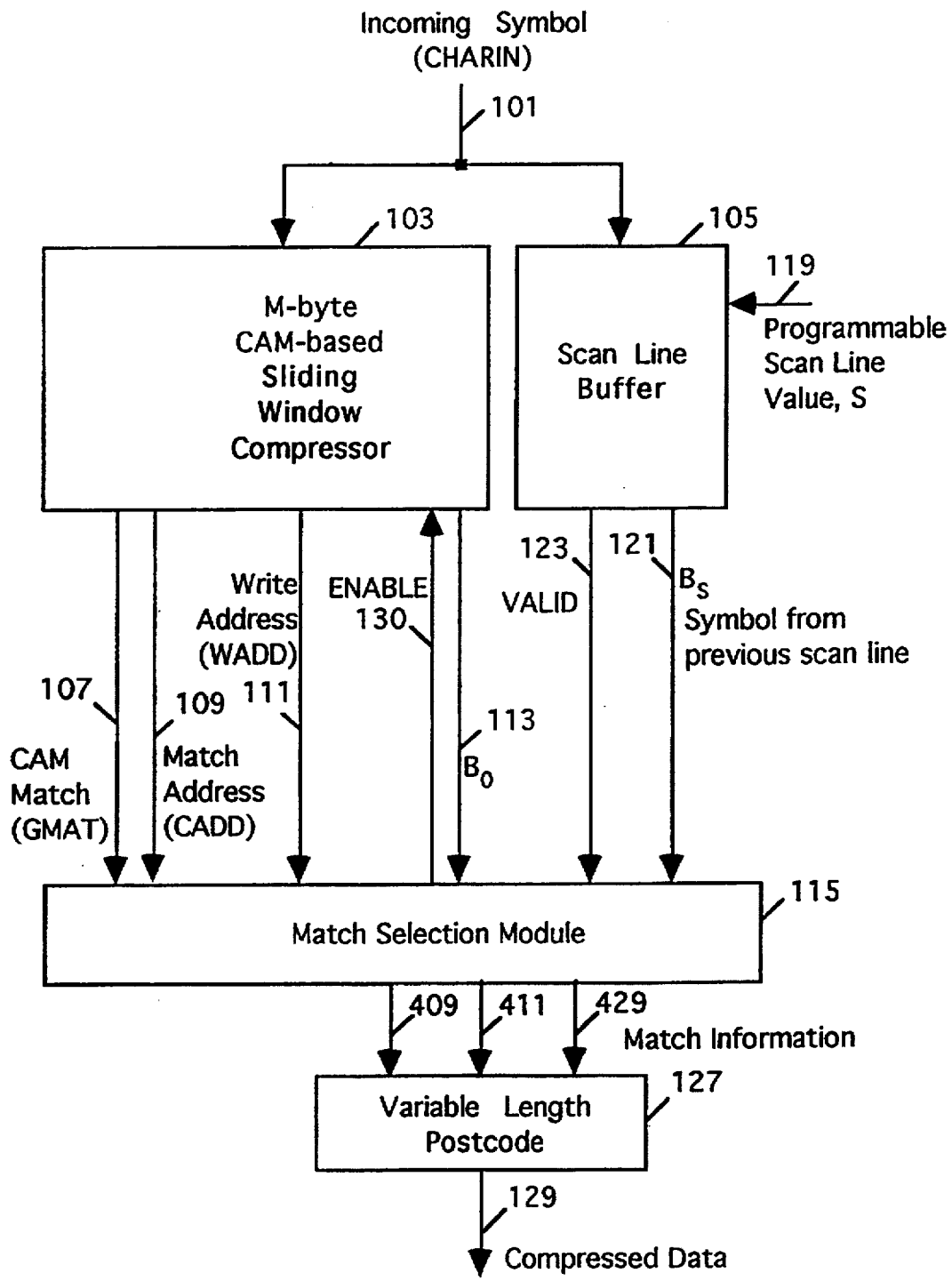
Figure 1: Block diagram of actual implementation of sliding window with big gap compressor

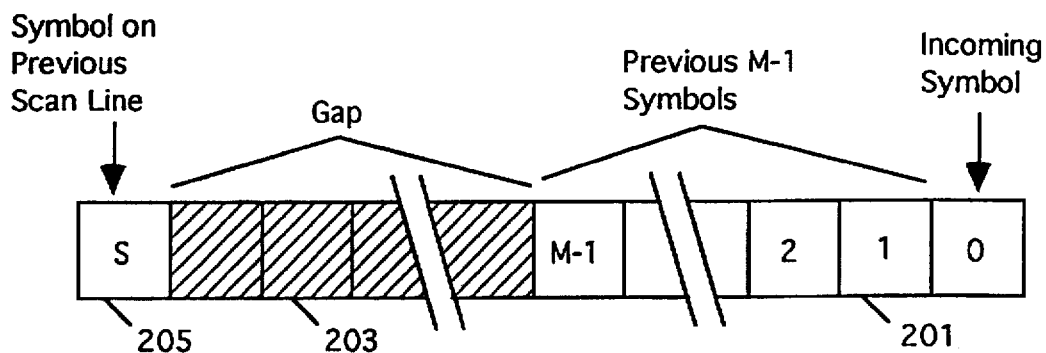
Figure 2a: Conceptual drawing of sliding window with big gap
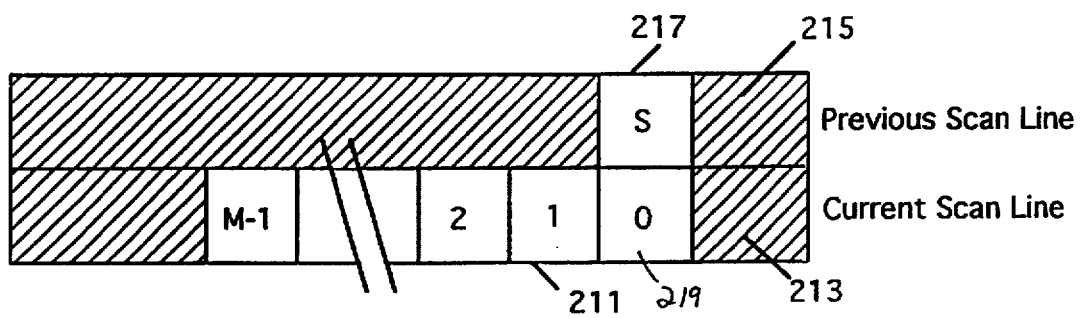
Figure 2b: Two-dimensional view of sliding window

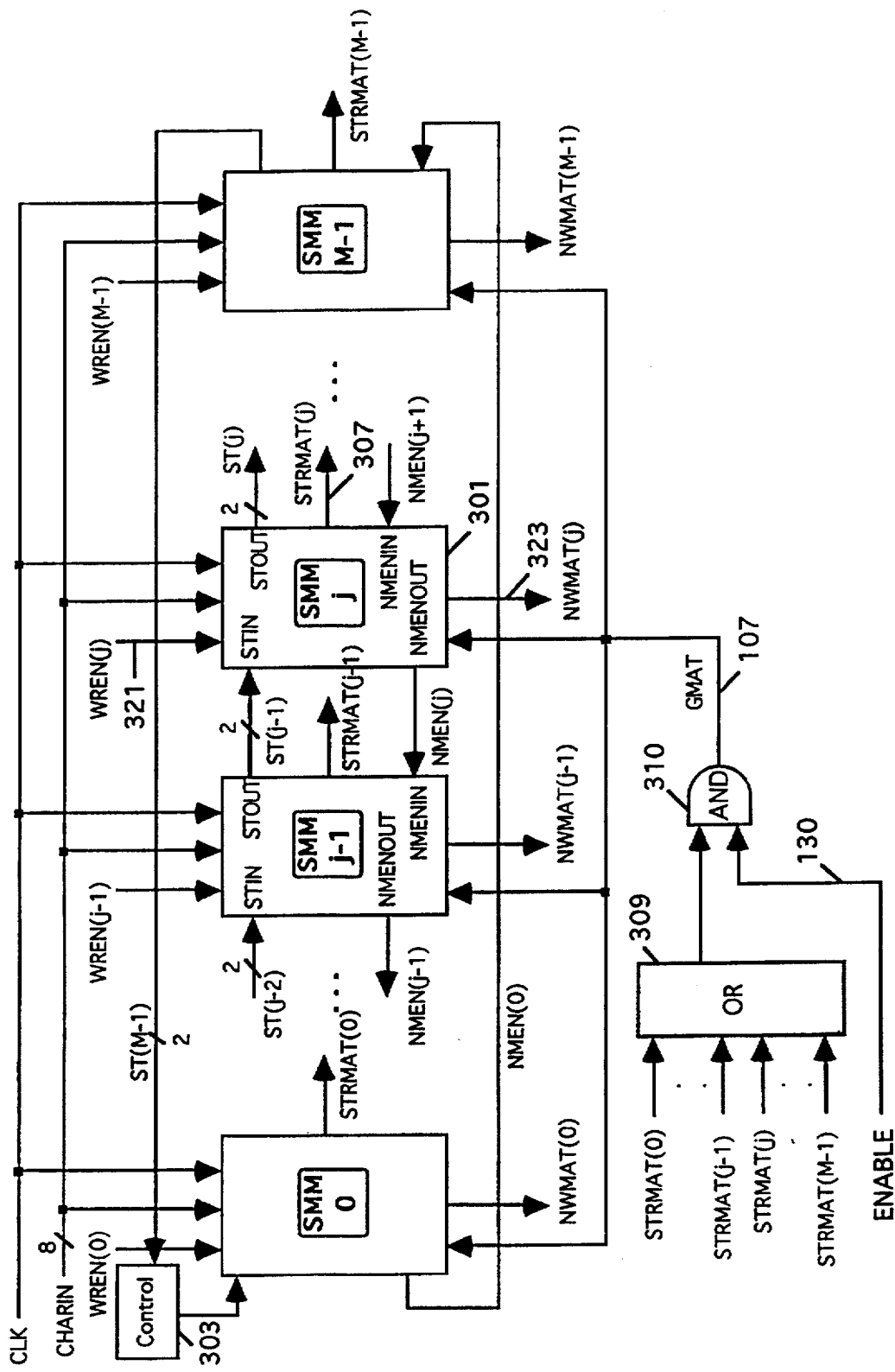
Figure 3a: String match module array for M-byte CAM-based sliding window compressor

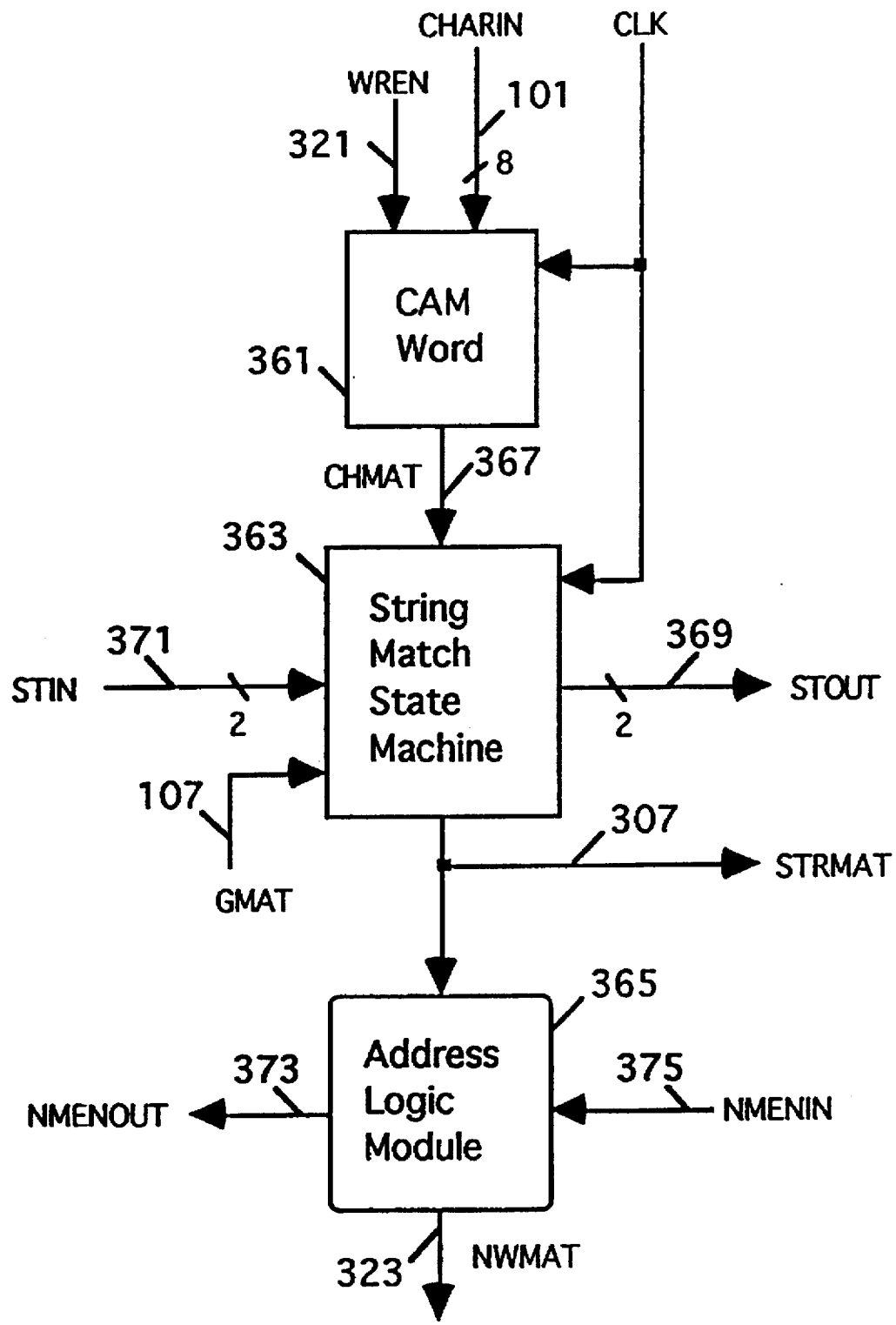
Figure 3b: String match module block diagram

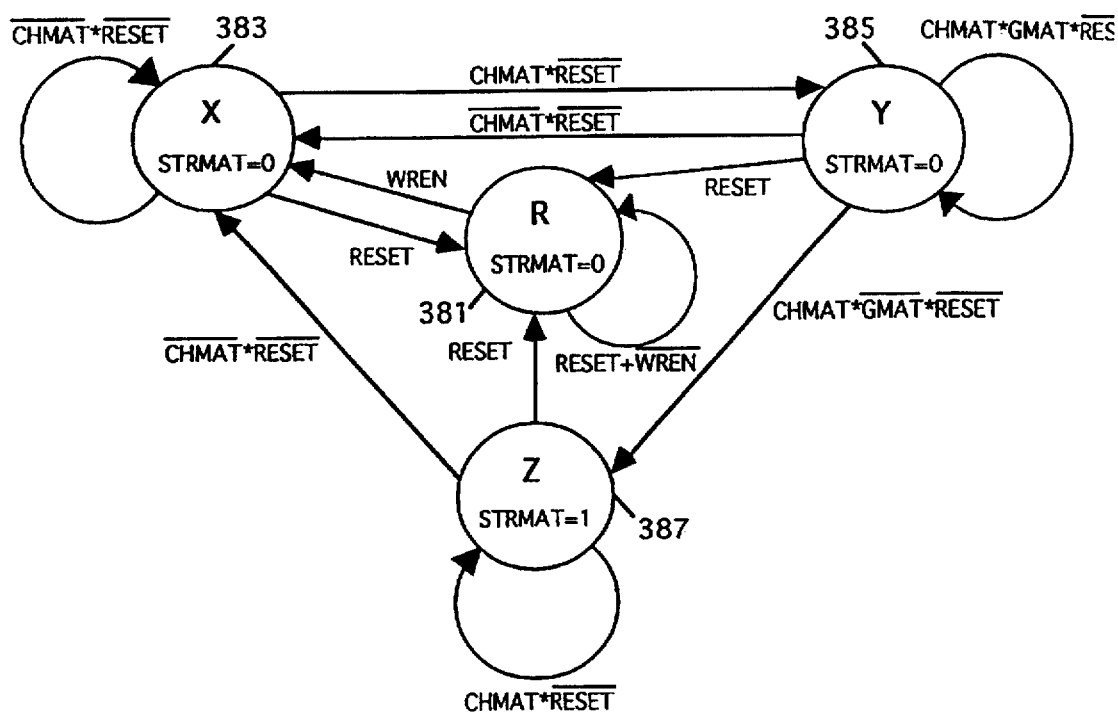
Figure 3c: State transition diagram governing string match state machine

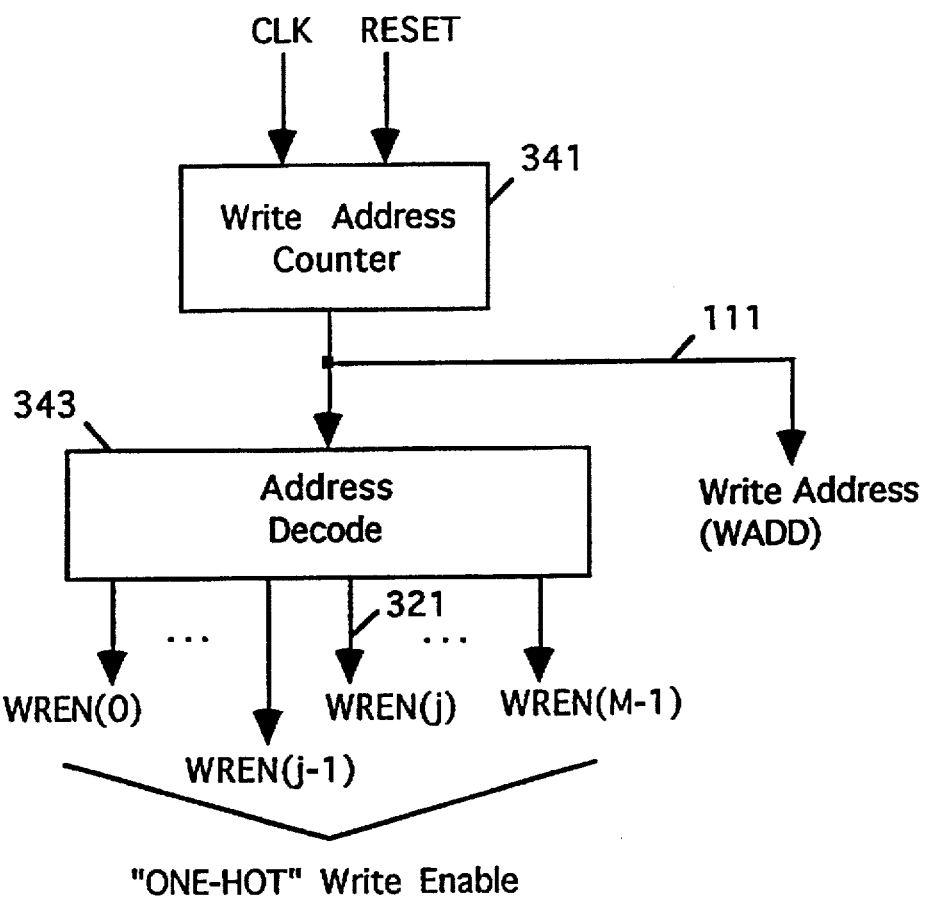
Figure 3d: CAM write address logic

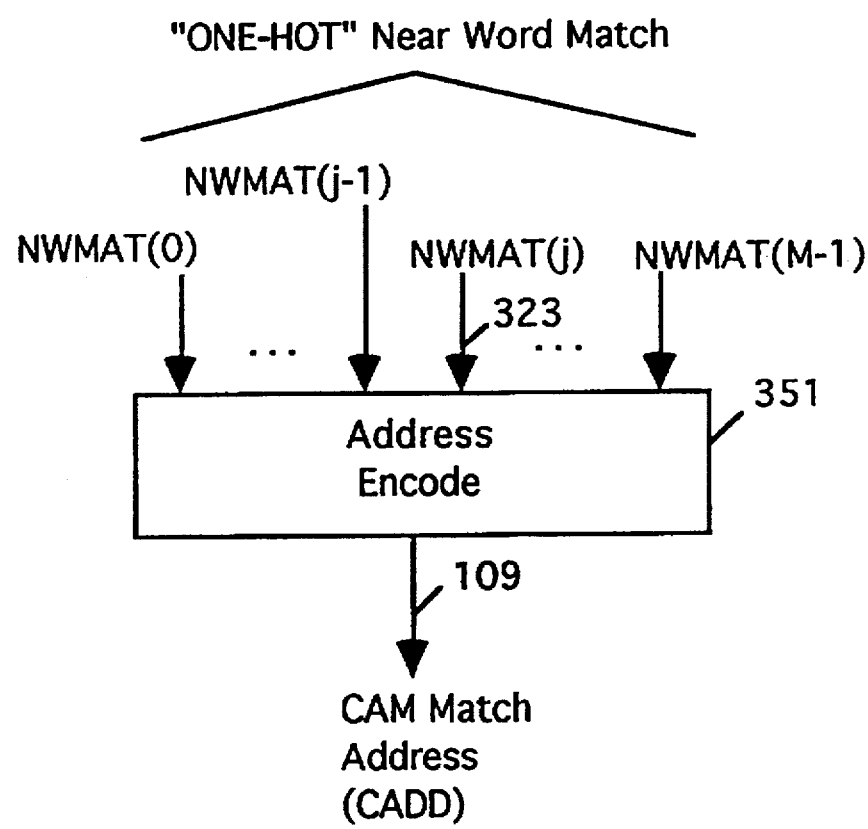
Figure 3e: CAM match address logic

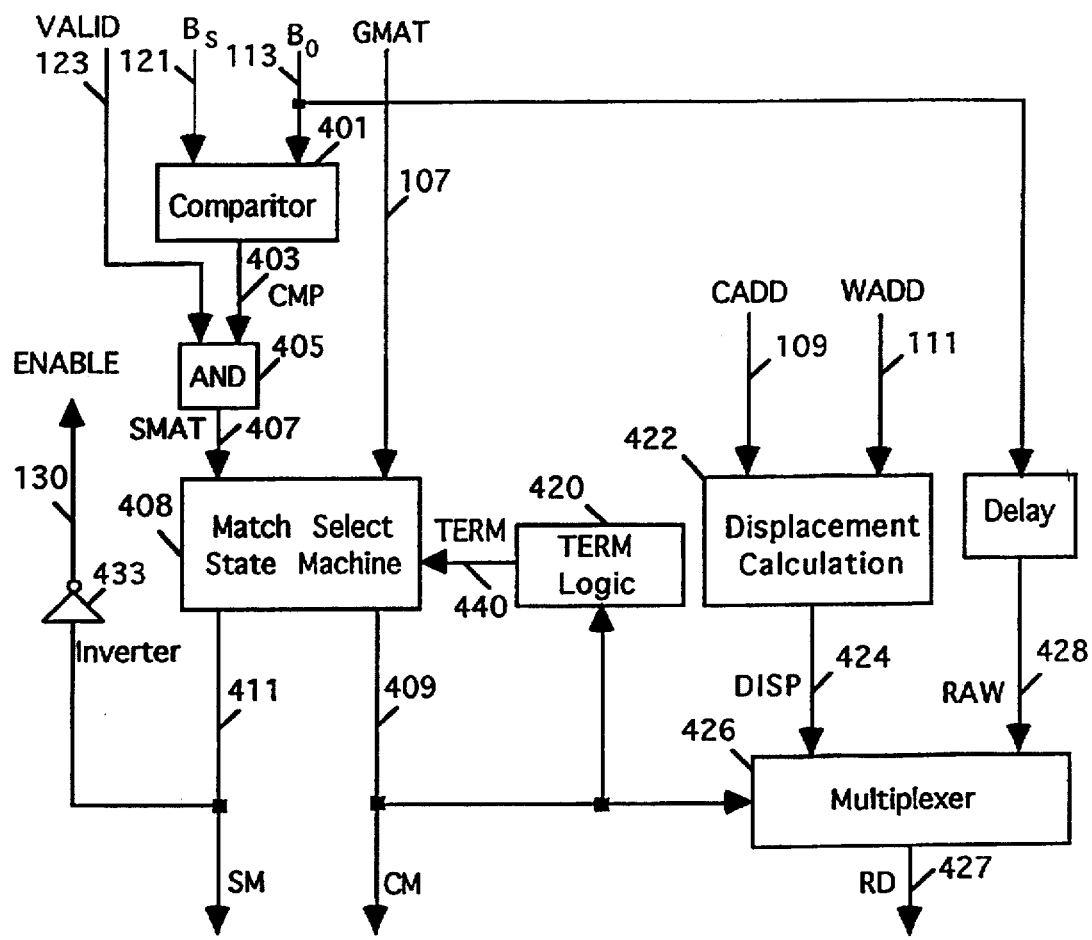
Figure 4a: Match selection module block diagram

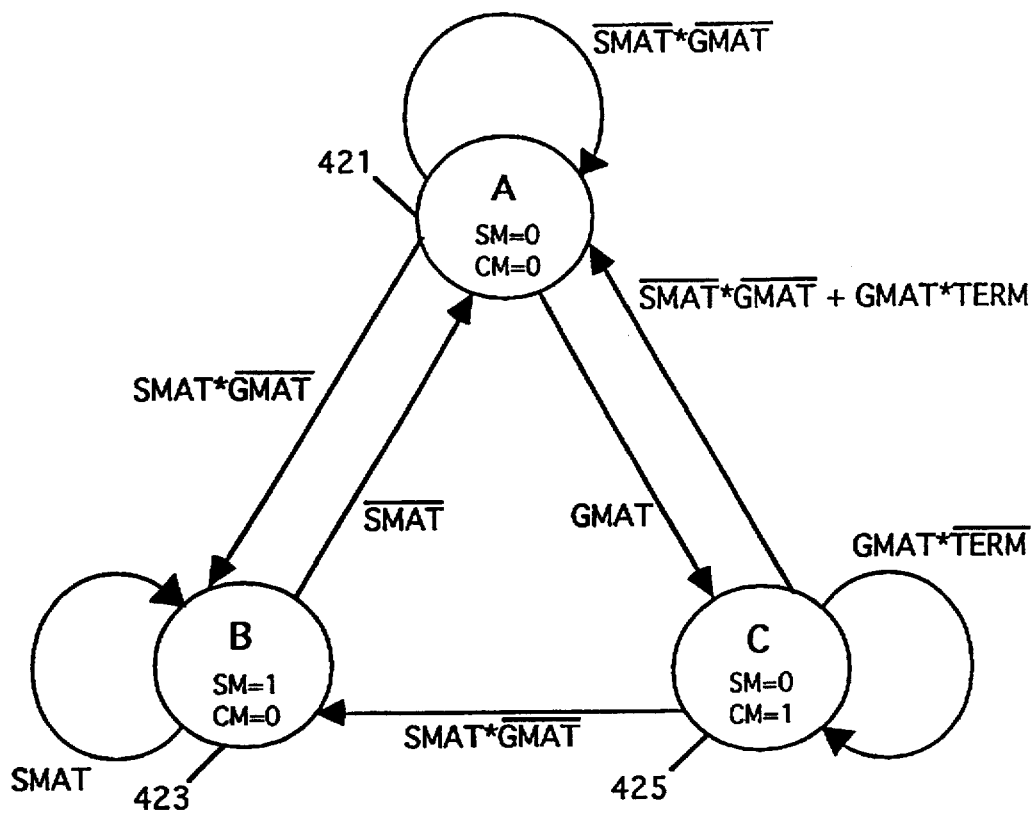
Figure 4b: State transition diagram for match select state machine

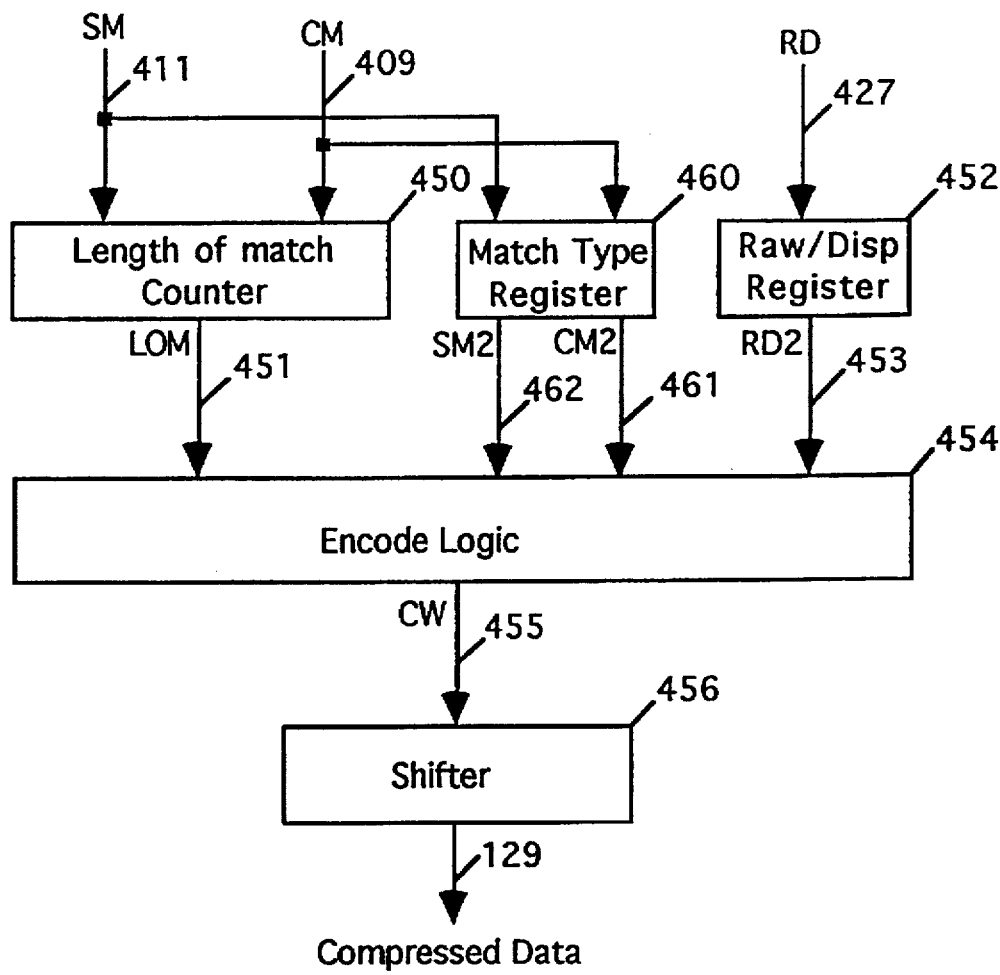
Figure 4c: Postcode encoder module block diagram

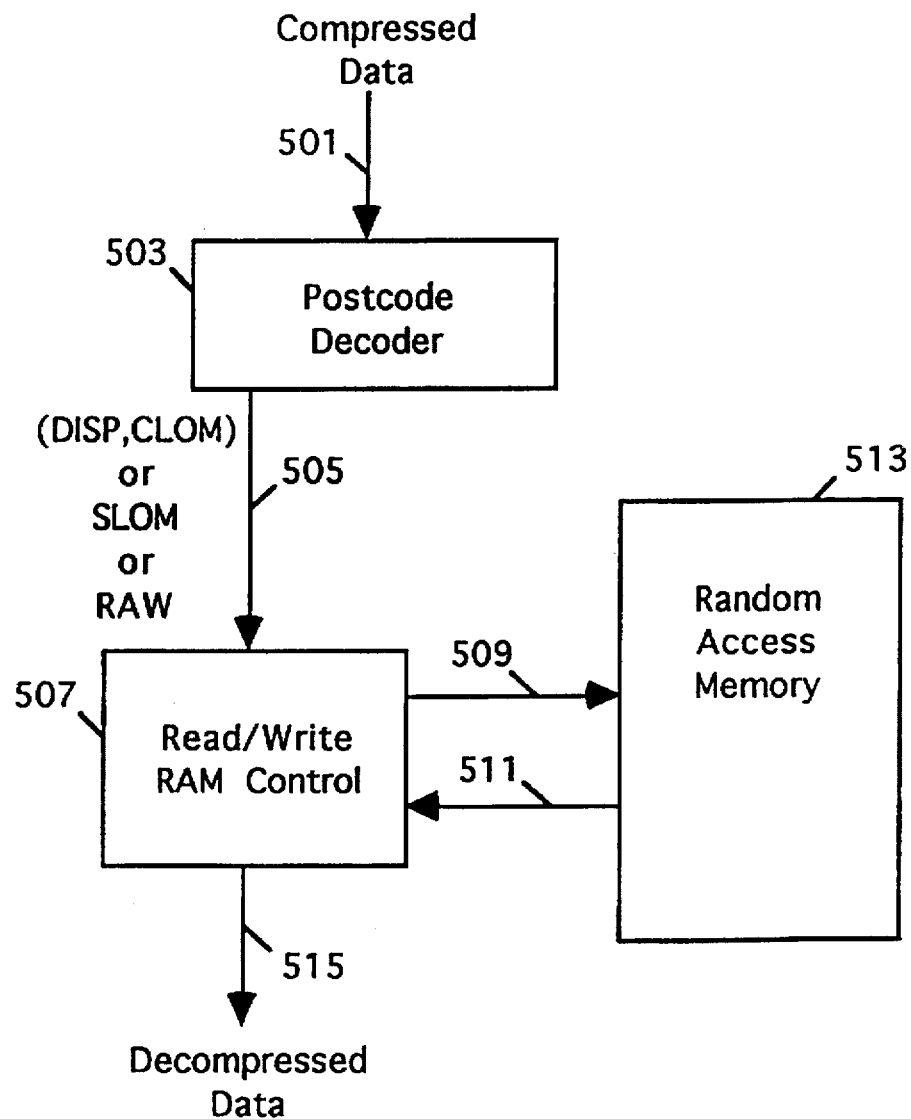
Figure 5: Block diagram of decompressor

SLIDING WINDOW WITH BIG GAP DATA COMPRESSION SYSTEM

FIELD OF THE INVENTION

The present invention relates to the field of data compression and decompression. More particularly, the present invention relates to data compressors which compress data using an adaptive and lossless scheme, and that work well on bilevel image data.

BACKGROUND OF THE INVENTION

The goal of data compression is to decrease the transmission time or storage space required for the data being compressed. Data compression is useful on a variety of data types, including text and image data. Many compression schemes have been developed for both text and image data. The books *Managing Gigabytes* by Witten, Moffat and Bell, and *Image and Text Compression*, edited by Storer, describe such compression schemes.

The efficiency of a data compressor is measured in a quantity called a compression ratio which is calculated by dividing the number of uncompressed characters by the number of compressed characters. The higher the compression ratio the greater the density of the compressed data. A compression ratio of 2 denotes that the number of characters after compression is half of the number of characters before compression.

Another important characteristic of a data compressor is how closely the output from the decompressor matches the original input. Compression techniques can be divided into two subdivisions, lossless and lossy. Lossless methods allow the exact reconstruction of the original data from the compressed data. Lossless methods are most appropriate for text compression applications or other applications where it is essential that the data be fully restored to its original condition. Lossy methods allow for some error to occur during compression and decompression. These types of methods are used where a good approximation is sufficient, such as on digitally sampled analog data.

Dictionary-based compression schemes are quite popular for text compression. In these lossless compression systems, the incoming text is used to build a dictionary that will be used to compress future data. In particular, a sliding dictionary, or sliding window compressor uses the last N text symbols as the dictionary. This is an adaptive scheme, since every new symbol updates the compression dictionary. Data is encoded by searching for a match between incoming symbols and the contents of the dictionary. If no match is found, the incoming symbol is sent "raw" or as is. If a match is found between a string of incoming symbols and a string with its first byte in the window when the first byte is input, a code pair is sent instead of sending the individual symbols. The code pair consists of the location in the window of the match relative to the incoming data and the length of the matching string. Compression is achieved in such a system when the number of bits required to represent a code pair is smaller than the number of bits required to represent the individual symbols. One implementation for a sliding window compressor is disclosed in U.S. Pat. No. 5,532,693, issued on Jul. 2, 1996, and entitled "Adaptive Data Compression System With Systolic String Matching Logic," which is hereby incorporated by reference.

The sliding window text compressor relies on the assumption that certain strings of symbols occur repeatedly, and that symbols are like their neighbors. Because this is often true of text files, this type of compressor can be used to compress such files quite effectively. On the other hand, this assumption is not a good one for certain types of image data, such as grayscale or color images. In this type of application, adjacent areas of the image may appear similar (e.g., slightly different shades of gray) but not exactly the same. The dictionary-based compressors require exact matches between symbols, as described above, and would not work well on such an image. A more effective approach for this type of image data is to use one of a family of lossy schemes, such as the JPEG standard, described in the reference paper "The JPEG Still Picture Compression Standard" by Gregory Wallace, *Communications of the ACM*, April 1991 or a lossless compression algorithm which has differential encoding, such as the Rice algorithm, described in "Algorithms for a Very High Speed Universal Noiseless Coding Module" by Rice, Yeh, and Miller, *JPL Publication* 91-1.

Certain types of image data, such as bilevel or black-and-white images included in facsimile or computer printer documents, are compressed effectively using a sliding window or other dictionary-based compressor. These images are most often represented using one bit per pixel, e.g. either black or white, and therefore exact matches between strings are much more likely than in grayscale or color images, where there is more than one bit used to represent a single pixel. To maximize compression of bilevel two-dimensional data, data correlations in both the horizontal and vertical directions need to be taken into account. Both correlations can be detected by making the sliding window large enough to contain at least an entire scan line. However, a scan line can contain a large number of symbols if the scanning or printing density is very high. This large window size complicates the sliding window compressor implementation.

Many simpler image compressors have been developed for bilevel data. An obvious choice for this application is a runlength compression code. The basic idea behind a runlength code is that runs of 0's and 1's are encoded in terms of the length of the run, usually using a variable length code. The runs can be either bit-wise or byte-wise. For example, the CCITT Group 3 and Group 4 standards for facsimile transmission, as described in the reference *Managing Gigabytes* by Witten, Moffat and Bell, describe runlength coding schemes that also incorporate comparisons of incoming data with the previous scan line. These types of schemes will generally do very well for the simplest data, whereas a sliding window compressor will do better for more complicated bilevel data since it takes into account more complicated patterns than just runs of 0's and 1's. A runlength coder can be considered to be a subset of a sliding window compressor, since a sliding window compressor takes runs into account by allowing matches with the previously compressed symbol. In this manner, not only runs of 0's and 1's are compressed, but also runs of other byte patterns.

For bilevel image compression, what is needed is a compression scheme that is both simple to implement and that will achieve good compression results on more complicated images.

SUMMARY OF THE PRESENT INVENTION

A sliding window with big gap data compression system is simple to implement and gives good compression over a wide variety of bilevel images. A sliding window compressor with a very small window size is utilized in conjunction with a storage buffer which is large enough to hold at least an entire scan line of data symbols. Coupled to the storage buffer is circuitry that checks for a match between the incoming data symbol and a symbol stored in one specific programmable location. This programmable location is preferably exactly one scan line length away. Match locations are either within the range of the small window or exactly equal to the specific programmable location. The entire compressor can be viewed as a sliding window with a big gap (SWBG). This sliding window is of a length corresponding to the length of the scan line, comprised of the small window followed by a big gap and then the one specific programmable location, at the end of the scan line.

BRIEF DESCRIPTION OF THE DRAWINGS

FIG. 1 illustrates a block diagram schematic of the sliding window with big gap (SWBG) compressor according to the present invention.

FIG. 2a illustrates a conceptual illustration of the sliding window with big gap.

FIG. 2b illustrates a two-dimensional interpretation of the sliding window.

FIG. 3a illustrates a block diagram schematic of the M-byte CAM utilized for the small sliding window of the present invention.

FIG. 3b illustrates a block diagram schematic of a string match module used within the M-byte CAM.

FIG. 3c illustrates a state transition diagram which controls the operation of the string match modules within the M-byte CAM.

FIG. 3d illustrates a block diagram schematic of the logic circuitry used to generate the CAM write address and write enable signals.

FIG. 3e illustrates a block diagram schematic of the logic circuitry used to generate the CAM match address.

FIG. 4a illustrates a block diagram schematic of the match selection module.

FIG. 4b illustrates a state transition diagram which controls the operation of the match selection state machine.

FIG. 4c illustrates a block diagram schematic of the logic circuitry of the postcode encoder.

FIG. 5 illustrates a block diagram schematic of the decompressor of the present invention.

DETAILED DESCRIPTION OF THE PREFERRED EMBODIMENT

The present invention is a hardware adaptive data compression system known as a sliding window with big gap (SWBG) compressor. A block diagram of the SWBG compressor is illustrated in FIG. 1. The data bus carrying the incoming symbol to be compressed CHARIN 101 is coupled to the M-byte Content Addressable Memory (CAM) sliding window compressor 103 and to the scan line buffer 105. The programmable scan line value S signal line 119 is also coupled as an input to the scan line buffer 105. The M-byte CAM-based sliding window compressor 103 has four outputs: a CAM match signal line GMAT 107; a CAM match address bus CADD 109; a write address bus WADD 111; and a current byte data bus $B_O$ 113. All of the outputs 107, 109, 111 and 113 are coupled as inputs to the match selection module 115. The scan line buffer 105 has two outputs: a signal line VALID 123 which indicates whether a whole scan line has been entered since the last dictionary reset; and a data bus $B_S$ 121 which transmits the symbol stored in the scan line buffer at a memory location which is exactly a scan line length away from the incoming symbol. Both of the outputs 121 and 123 from the scan line buffer 105 are also coupled as inputs to the match selection module 115. The match selection module 115 decides whether to output a scan line or a CAM match when both are occurring. The outputs of the match selection module 115 include the scan line match signal line SM 411, the CAM match signal line CM 409, and the raw data signal line RD 429 are coupled as inputs to the variable length postcode encoder 127 which in turn outputs compressed data to the storage system on the signal line 129.

As illustrated in FIG. 1, an incoming symbol or byte to be compressed CHARIN on the data bus 101 follows two parallel paths. The first path is through the M-byte CAM-based sliding window compressor 103 where it is compared to M previous symbols contained within the sliding window. The compressor 103 may be implemented using any appropriate type of sliding window compressor. Preferably, the compressor 103 is of a type as described in the U.S. Ser. No. 05/532,693, referred to above. The operation of this compressor 103 will be described in detail below. In the preferred embodiment, the CAM-based sliding window compressor is of a size where the window size M is equal to 16. The sliding window compressor 103 compares the incoming symbol to the symbols stored in the CAM 103 and outputs the appropriate information to the match selection module 115.

The second path followed by the incoming symbol or byte to be compressed CHARIN is through the scan line buffer 105. The scan line buffer 105 first stores the incoming symbol in the next available memory location for retrieval later. The programmable scan line value S is equal to the scan line length in bytes. Preferably, the scan line buffer 105 is capable of storing 2048 bytes. In this embodiment the scan line length value S could be any number in the range from 1 to 2047 inclusive and therefore 11 bits are required to specify the scan line length value S.

Using the scan line length value S, the scan line buffer 105 outputs the symbol $B_S$ on the data bus 121. The symbol $B_S$ is the symbol which is stored in the scan line buffer exactly the scan line length value S symbols away from the incoming symbol. The scan line buffer 105 also outputs a signal on the signal line VALID 123 which notifies the match selection module 115 that at least S values have entered the scan line buffer since the last dictionary reset. The signal on the signal line VALID 123 therefore notifies the match selection module 115 that the value $B_S$ on the data bus 121 is valid.

Using the information from the CAM-based sliding window compressor 103 and the scan line buffer 105, the match selection module 115 determines which match to choose if more than one has occurred, or decides on a raw byte if no match has occurred. The variable length postcode logic block 127 uses the signals from the match selection module 115 to determine the length of any matches and then encodes scan line matches, CAM matches, or raw bytes into variable bit-length codewords. The variable bit-length codewords are then concatenated, divided into bytes and sent on the output signal lines 129 to the storage or transmission system.

The CAM-based sliding window compressor 103 and the scan line buffer 105 can be considered conceptually as a sliding window with a big gap as illustrated in FIG. 2a. FIG. 2a is presented to illustrate the concept of the present invention only and does not represent a practical implementation of the invention. The sliding window shown in FIG. 2a includes S+1 cells 201. The M cells on the right numbered 0 through M−1 represent the sliding window of the sliding window compressor 103 where the last M bytes of incoming symbols in the data stream, including the incoming byte, are stored. In each of these cells, except the cell 0 which stores the incoming byte, matches between the incoming byte and the bytes stored within this sliding window are checked.

The gap section 203 follows the first M cells. The cells within the gap section 203 are used for storage but no matching with the incoming byte is checked. There are S+1−M cells within the gap. The gap section 203 represents the scan line buffer where the bytes of incoming data are stored. The final cell 205 represents the symbol $B_S$ and contains the byte that is exactly one scan line length S away from the current incoming byte. Matching is checked within this cell by the match selection module 115 as will be described below.

With the value of the scan line length S programmable, the sliding window of FIG. 2a is a variable length sliding window with a gap. The illustration of FIG. 2a implies that incoming bytes are shifted into the right side of the window and previously stored bytes shift to the left, with the byte stored in the cell 205 shifting out of the window each time a new byte enters. In the actual implementation of the present invention, the sliding window is a circular queue with the data held stationary and the write address pointer and state information moving.

A second conceptual representation of the sliding window of the present invention is illustrated in FIG. 2b. This figure is also included for illustrative purposes only and does not represent the actual implementation of the present invention. In FIG. 2b, the position of the sliding window 211 is shown with respect to the current scan line 213 being compressed and the previously compressed scan line 215. The cell 217 which is exactly a scan line length away from the incoming data byte is shown positioned above the cell 219 which stores the incoming data byte.

The sliding window compressor 103 is comprised of the chain of string match modules (SMM) 301 with the required control circuitry, as illustrated in FIG. 3a. The current input symbol is written to the current string match module, symbolized as SMM(j) 301, by enabling the write enable signal line WREN(j) 321. On the following clock cycle, the next input is written to the next string match module in the array SMM(j+1).

The value of j starts at 0 and is incremented by 1 a maximum of once every clock cycle. While data is stationary in the array, state information is shifted between the adjacent SMMs on the state signal lines ST(j). The state signal lines ST(j) indicate that either no match is occurring, that the SMM 301 is at the beginning of a match, or that the SMM 301 is in the middle of a match.

A single global match (GMAT) signal 107 is used to indicate when any SMM 301 is in the middle of a match. The signal line GMAT 107 is an input to each of the SMMs. The signal line GMAT 107 provides two functions. The global match signal GMAT 107 indicates the CAM has detected a matching string of at least two characters. Secondly, the global match signal GMAT 107 provides a mechanism to ensure only the longest matching string is reported. The global match signal GMAT 107 provides the second mechanism by controlling the state machines 363 inside the SMM 301 modules described later. The global match signal GMAT 107 is activated by the OR-gate 309 and the AND gate 310 when any of the string match signal lines STRMAT(j) 307 are active and the signal ENABLE 130 is active. The signal line ENABLE 130 is used in the preferred embodiment for better compression and is described with the match selection module 115.

Each SMM 301 has a near-match-enable signal NMEN(j). The near-match-enable signals NMEN(j) are daisy-chained between the SMMs to determine which of the SMMs reporting the longest current string match is nearest to the head of the queue. The head of the queue is considered to be the SMM 301 in the array where the current input symbol is being written, which is where the write enable signal line WREN 321 is active.

Each SMM 301 also has a nearest-word-match signal NWMAT(j) 323. No more than one nearest-word-match signal NWMAT(j) 323 may be asserted during each clock cycle, indicating the location of the SMM 301 containing the last symbol of the longest current string match nearest to the active write enable signal WREN(j) 321.

The structure of a string match module is illustrated in FIG. 3b. Each SMM 301 consists of a CAM word 361, a string match state machine 363 and an address logic module 365.

Each CAM word 361 stores a one byte symbol from the Input bus CHARIN 101 when the write enable signal line WREN 321 for that SMM 301 is active. When the write enable signal line WREN 321 is inactive and the CAM word 361 is not being written to, it is being searched for the input symbol that is currently being written at the head of the queue. The character match signal line CHMAT 367 is asserted by the CAM word 361 when the contents of the CAM word 361 matches the symbol on the input bus CHARIN 101. This character match signal is then passed on to the string match state machine (SMSM) 363. The character match signal line CHMAT 367 is disabled when the write enable signal line 321 is active in the SMM 301.

The function of the SMSM 363 is to track the status of the buffer string whose last symbol resides in the associated CAM word 361 of the present SMM 301. Each SMM 301 has a pair of signal lines STOUT 369 which assert that the buffer string does not match the current input string, is at the beginning of a match or is in the middle of a match. This pair of signal lines STOUT 369 is coupled to the next SMSM 363 in the array as a pair of signal lines STIN 371. This state information is shifted between the SMSMs once, each time a new character is input from the input bus CHARIN 101. The state information is passed in the same direction as the write enable signal WREN 321.

Each SMM 301 includes a string match signal line STRMAT 307 which is coupled between the SMSM 363 and the address logic module 365. The signal line STRMAT 307 is asserted by the SMSM 363 when the buffer string matches at least the last two characters of the current input string, e.g. is in the middle of a match. State information is shifted right, in the direction of the active write enable signal WREN 321, on each clock cycle that a new input symbol is accepted.

The address logic module (ALM) 365 is a module that outputs the near word match signal line NWMAT 323 and the near match enable out signal line NMENOUT 373. The ALM 365 is a combinational logic block that determines whether a match in the SMM 301 is nearest to the active write enable signal line WREN 321. This is required when multiple string matches occur. The ALM 365 asserts the near word match signal line NWMAT 323 when the SMM 301 is indeed the nearest match. The signal line NWMAT 323 is derived from the signal line STRMAT 307 in the present SMM 301 and the near match enable in signal line NMENIN 375 which is input from the adjacent SMM. When the near match enable in signal line NMENIN 375 is active there are no SMMs containing active STRMAT signal lines 307 between the present SMM 301 and the head of the queue. Therefore, the near word match signal line NWMAT 323 asserts that the present SMM 301 contains the last symbol of the most recent instance of the longest buffer string matching the current input string. If the signal line NMENIN 375 is active and the signal line STRMAT 307 is also active, then the present SMM 301 contains the nearest match. If the signal line NMENIN 375 is inactive the nearest match is closer to the previous active write enable signal line WREN 321. The ALM 365 also produces an output signal NMENOUT 373 which is the signal NMENIN 375 for the adjacent SMM. The basic functions of the signal lines NWMAT 323 and NMENOUT 373 are given by the following equations:

NMENOUT=WREN+NMENIN*STRMAT

NWMAT=$\overline{\text{WREN}}$*NMENIN*STRMAT

The near match enable signals NMENOUT 373 and NMENIN 375 are passed in the direction opposite to the movement of the write enable signal WREN 321.

A state transition diagram for the string match state machine (SMSM) 363 is shown in FIG. 3c. The SMSM 363 resembles a Moore style state machine in that its output, the string match signal line STRMAT 307, is only a function of the present state of the previous SMM 301 and is not combinationally dependent upon any inputs to the previous SMM 301. This has the advantage of allowing greater clock speeds in applications such as the present invention.

Unlike ordinary state machines, the present state variables are not fed back as inputs to the next state logic, rather they are shifted to the SMSM 363 in the adjacent SMM 301 in the array. Therefore, the SMSM modules 363 may be thought of as synchronous logic array elements. It should be noted that the SMSM function and the global match protocol presented here would provide clock rate improvements to a Whiting style compression architecture as well, where the input data physically shifts within the buffer and the SMSM state information remains stationary. Thus, in a Whiting style architecture, the SMSMs would appear as ordinary Moore style state machines.

In order to facilitate a fast initialization of the SMSMs, upon dictionary reset, all SMSMs are forced into the reset state R 381. The reset state R 381 signifies that the buffer word has not yet been written to, and therefore the SMSM 363 cannot assert the global match signal GMAT 107. The CAM word 361 is considered to be empty and no matches can occur during the reset state R 381. The SMSM 363 leaves the reset state R 381 only after the CAM word 361 for that SMM has been written to. When the write enable signal line WREN 321 is asserted for a given buffer word, its SMSM 363 goes to the state X 383 and begins to look for a match string. To prevent the reset state of the last module (module n-1) from being passed onto the first module (module 0), a simple logic circuit is used. This circuit will always pass a state of X if the module n-1 is in the reset state R 381.

The SMSM 363 determines whether the contents of the CAM word 361 does not match the current input string, is at the beginning of a match, or is within a match string which matches at least the last two characters of the current input string. When the SMSM 363 has moved from the reset state R 381 to the state X 383, this signifies that the system is beginning to receive data to compress, but the word stored in the CAM word 361 for the SMM 301 does not match the current input symbol being stored at the head of the queue. When the signal line CHMAT 367 is activated signalling that the word stored in the CAM word 361 does match the current input symbol being stored at the head of the queue, the SMSM 363 moves to the state Y 385, indicating that only the last input symbol was matched.

If the SMSM 363 is already in the state Y 385, a second matching character will move the SMSM 363 from the state Y 385 to the state Z 387. The state Z 387 denotes that the present SMM 301 has detected a compressible match string of the greatest known length. Here the signal line STRMAT 307 is activated, for the SMM 301 whose SMSM 363 has moved to the state Z 387, which activates the signal line GMAT 107. Since more than one instance of the longest match may occur, more than one SMM 301 may assert the signal line STRMAT 307 and move to the state Z 387 in the same clock cycle, indicating that multiple instances of the current longest match string have been detected.

Since the string match state machines SMSM 363 must transition to state Y and then to state Z, the global match signal GMAT 107 will not go active until the second byte of a match. Once active, the global match signal GMAT 107 will remain active until the character on the input bus CHARIN 101 fails to match all of the cells 361 whose adjacent state machines 363 are in the Z (matching) state. Back to back CAM matches at different displacements are possible. The global match signal GMAT 107 will simply de-assert for the first byte of the second match.

When a string match occurs within the sliding window compressor 103, the global match signal GMAT 107 is activated and the match selection module 115 is notified. The address of the CAM word 361 which was matched is also transmitted to the match selection module 115 on the address bus 109.

FIG. 3d illustrates the counter 341 required to compute the CAM write address WADD which is transmitted to the match selection module 115 on the address bus 111. In the preferred embodiment, the sliding window compressor 103 contains 16 cells and thus a four-bit write address counter 341 will suffice. Correspondingly, in alternate embodiments if the sliding window compressor 103 includes additional cells then the write address counter 341 must be expanded to include additional bits. The write address counter 341 is coupled to the address decoder 343, by the write address bus WADD 111 which is used to convert the write address on the write address bus 111 to the appropriate value for the write enable signal WREN(j) 321 required by the SMM array as illustrated in FIG. 3a.

FIG. 3e illustrates the address encoder 351 which computes the CAM match address CADD to be transmitted on the address bus 109. The near word match signals NWMAT (j) 323 from each of the ALMs 365 are input to the address encoder 351 and used to compute the CAM match address CADD which is output on the address bus 109. The hardware illustrated in both FIGS. 3d and 3e is included within the sliding window compressor 103.

The parallel data path to the CAM-based sliding window compressor 103 is the scan line buffer 105. The scan line buffer 105 accepts an incoming symbol from the data bus CHARIN 101, stores that symbol within the buffer and outputs the symbol $B_S$ that was stored S bytes previously, on the data bus 121. The scan line buffer 105 operates as a programmable length first-in first-out (FIFO) buffer. In addition to outputting the symbol $B_S$, the scan line buffer 105 also outputs the signal VALID on the signal line 123. The signal VALID is active when at least S bytes have been stored in the scan line buffer 105 since the last dictionary reset. After a dictionary reset, the signal VALID is activated after exactly a scan line of S bytes has been stored in the scan line buffer 105.

A block diagram schematic of the match selection module 115 is illustrated in FIG. 4a. The signal lines 113 and 121 which transmit the current input byte $B_O$ and the previous input byte $B_S$ which is one scan line length away, respectively, are coupled as inputs to the comparator 401. It should be noted that the two bytes $B_O$ and $B_S$ are exactly a scan line length of S bytes apart in the scan line buffer 105. The comparator 401 will compare the two bytes $B_O$ and $B_S$ and output the result CMP on the signal line 403. The signal CMP is active only when the two bytes $B_O$ and $B_S$ are equal. The signal line 403 is coupled as an input to the AND gate 405. The signal line 123 which transmits the signal VALID is coupled as the other input to the logical AND gate 405. The logical gate 405 performs a logical AND operation on the signal CMP and the signal VALID and outputs the result SMAT on the signal line 407.

The scan line match signal 407 is coupled as an input to the match select state machine 408. The signal line 107 which transmits the global match signal GMAT is also coupled as an input to the match select state machine 408. As will be explained in detail below, the match select state machine 408 arbitrates between matches on the two parallel paths giving precedence to the CAM matches when there is both a CAM match and when the comparator 401 signals that the two bytes $B_O$ and $B_S$ are equal. The match state machine outputs the CAM match signal CM on the signal line 409 when a CAM match is selected and the scan line match signal SM on the signal line 411 when a scan line match is selected.

The terminate logic block 420 generates a match terminate signal TERM when the CAM match length is limited to a programmable maximum value. The signal TERM is transmitted on the signal line 440 which is coupled as an input to the match select state machine 408. In the preferred embodiment the signal TERM is activated when the CAM length of match value CLOM is equal to 256. In the preferred embodiment, the postcoder limits scan line matches to a maximum of 256. For example, a scan line match of length 257 can be broken into codewords for a scan line match of length 256 followed by another of length 1. However, a CAM match of length 257 cannot be broken up the same way because CAM matches of length 1 are not allowed. The termination logic forces a codeword of length 256 followed by a single raw byte. Hence the termination logic is necessary to break CAM matches longer than 256 into a series of smaller ones.

The CAM match address CADD address bus 109 and the write address WADD address bus 111 are coupled as inputs to the displacement calculation circuit 422. The displacement calculation circuit 422 calculates a displacement value DISP which relates the CAM match location with respect to the byte being written in the CAM when the match ended. This match location or displacement value DISP is output on the signal lines 424.

The current input byte $B_O$ signal line 113 is coupled to the delay block 450 where it is delayed an appropriate amount of time. The output 428 of the delay block 450 is coupled as an input to the multiplexer 426. The multiplexer 426 outputs a raw byte 428 onto the raw data signal line RD 427 whenever the CAM match signal CM 409 and the scan line match signal SM 411 are both inactive. The multiplexer 426 outputs a CAM match displacement DISP 424 onto the raw data signal line RD 427 whenever the CAM match signal CM 409 is active. In the preferred embodiment, the multiplexer 426 outputs a raw byte 428 when the scan line match signal SM 411 is active, but the value is never needed or used.

The match select state machine 408 is governed by the state transition diagram illustrated in FIG. 4b. The state A 421 corresponds to no match, the state B 423 corresponds to a scan line match of at least one byte and the state C 425 corresponds to a CAM match of at least two bytes. In the preferred embodiment of the present invention a CAM match of at least two bytes takes precedence over a scan line match of one byte when the match select state machine 408 is in the state A 421. Therefore, when the match select state machine 408 is in the state A 421 and there is a CAM match of at least two bytes the match select state machine 408 will move to the state C 425 and the CAM match signal CM will be activated. From either the state A 421 or the state C 425, if there is no CAM match but there is a scan line match, the match select state machine 408 will move to the state B 423 and the scan line match signal SM will be activated. If a CAM match reaches the maximum length, the signal TERM will be activated and the match terminated, thereby moving the match select state machine back to the state A 421. The enable signal ENABLE 130 is used in the preferred embodiment to improve compression. The CAM and scan line match circuitry can operate completely in parallel letting the match selection state machine 408 arbitrate. However the compressor would be less efficient in the following scenario: A scan line match SMAT 407 and CAM match signal GMAT 107 are both currently active and the match selection state machine 408 is outputting the scan line match. Furthermore, the data stream contains a string that matches at a smaller displacement, is shorter than the CAM match(es) that first asserted the match signal GMAT 107, and starts during the scan line match. If the CAM match signal GMAT 107 is still active when the scan line match terminates, the compressor would switch to a CAM match but one with a longer than optimal displacement. In the preferred embodiment, when the match selection state machine is in the state C, the enable signal ENABLE 130 is de-asserted, suppressing the global match signal GMAT 107, and thus preventing CAM matches. Doing this ensures that when a scan match ends, any subsequent CAM match will have the smallest possible displacement.

The outputs of the match selection state machine, the scan line match signal SM 411 and the CAM match signal CM 409, are coupled along with the raw data signal line RD 427 to the postcode module. The postcode module 127 determines the lengths of any matches by how many clocks the scan line match signal SM 411 and the CAM match signal CM 409 are active. For a scan line match the length is the number of clocks the scan line match signal SM 411 is active. For a CAM match the length is one more than the number of clocks the CAM match signal CM 409 is active because the CAM match signal CM 409 is inactive for the first clock of a CAM match. Since the scan line match signal SM and the CAM match signal CM are mutually exclusive, a single length of match counter 450 can determine the lengths of matches. The length of match count LOM 451 is output from the counter 451 to the encode logic 454. The register outputs SM2, CM2, and RD2 are simply the scan line match signal SM 411, the CAM match signal CM 409, and the raw data signal RD 427, respectively, delayed to correspond to the length of match counter output LOM 451. The encode logic 454 outputs a codeword CW 455 corresponding to a scan match of length LOM when the register output SM2 462 transitions inactive. The encode logic 454 outputs a codeword CW 455 corresponding to a CAM match of length LOM and the displacement output RD2 453 when the output CM2 461 transitions inactive. The encode logic 454 outputs a codeword CW 455 corresponding to a raw byte RD2 453 when the output SM2 462 and the output CM2 461 are inactive for the current and previous clock. The shifter 456 accepts entire codewords CW 455 and divides them into individual compressed bytes which are then output on the signal line 129.

Table I illustrates the postcode of the preferred embodiment with the sliding window length M equal to 16, a CAM match length range from 2 to 256, and a scan line match length range from 1 to 256. The postcode is shown in Backus-Naur format.

A block diagram schematic of a decompressor according to the present invention is illustrated in FIG. 5. The compressed data is transmitted on the signal lines 501 from the storage or transmission system to the decompressor. The signal lines 501 are coupled as an input to the postcode decoder logic block 503. The postcode decoder logic block 503 converts the incoming variable length codewords to either a CAM match code pair (DISP, CLOM), a scan line length of match value SLOM or a raw byte RAW, according to the codeword and the preceding flag bits, as described above.

The output of the postcode decoder logic block 503 is transmitted on the signal lines 505. The signal lines 505 are coupled as an input to the read/write random access memory (RAM) control logic block 507. The RAM control logic block 507 is coupled to the random access memory (RAM) 513 by the signal lines 509 and 511. Preferably, the RAM 513 is capable of storing 2048 bytes. Using the information from the postcode decoder logic block 503, the RAM control logic block 507 writes and reads the appropriate bytes to and from the RAM 513. The RAM control logic block 507 then outputs the decompressed bytes on the signal lines 515 to the host. Specifically, if the postcode decoder logic block 503 is reporting a raw byte, RAW, the RAM control logic block 507 will write that byte to the RAM 513 using the signal lines 509 and will also output the raw byte, RAW, on the output signal lines 515. If the postcode decoder logic block 503 is reporting a scan line length of match value SLOM, then the RAM control logic block 507 will read the appropriate address in the RAM 513, e.g. one scan line length previous to the current RAM write address, write that byte to the RAM 513 at the current write address and output that byte on the output signal lines 515. This will occur for a number of bytes equal to the value specified by the scan line length of match value SLOM, incrementing the RAM 513 write address for each byte. If the postcode decoder logic block 503 is reporting a CAM match code pair (DISP, CLOM), the RAM control logic block 507 will read the byte from the appropriate address in the RAM 513, specified by subtracting the display value DISP from the current RAM write address, write that byte to the RAM 513 at the current write address and output that byte on the output signal lines 515. This will occur for a number of bytes equal to the value specified by the CAM length of match value CLOM, incrementing the RAM 513 write address for each byte.

To illustrate the compression and decompression processes, the following example is presented and described. Consider the sequence of bytes, expressed in hexadecimal, given below.

```
00 00 00 00 00 00 00 00 00 00 ff ff 00 00 00 00 00 00 00 00
00 00 00 00 00 00 00 00 00 03 ff ff c0 00 00 00 00 00 00 00
00 00 00 c0 00 00 00 3c c3 07 ff ff ff ff e0 3c c3 3c c3 00
```

This stream of data is input on the data bus 101 to the data compressor of the present invention, with a CAM sliding window size M equal to 16 and a scan line length S equal to 20. If the bytes are encoded from left to right and then top to bottom, the resulting sequence of compressed data will be output from the data compressor of the present invention, where raw bytes are expressed in hexadecimal, CAM match code pairs are expressed in decimal as (DISP, CLOM) and scan line match lengths are expressed in decimal as (SLOM).

```
00  (1,09)  ff ff  (c,0a)
(07)  03  (02)  c0  (0a)
(b,04) 3c c3 07 (02) (1,02) e0 (8,02) (2,02) (01)
EOR
```

When the above information is output from the postcode logic block 127, it will be encoded with the appropriate preceding flag bits, as described above, for transmission to the storage or transmission system.

Since the first 20 bytes form the first scan line, no matches to the previous scan line can occur due to the signal VALID 123 being active. The first byte is output as a raw. The second byte starts a CAM match with a displacement of one and a length of match of nine (1,9). The byte 11 is output as a raw byte since it does not match any previous bytes. The byte 12, while matching the tenth, is still output as a raw byte because two consecutive bytes must match before the global match signal GMAT 107 goes active. The byte 13 generates character matches at displacements 3 through 12 causing the corresponding string match state machines 363 to enter the first match state 385. The byte 14 continues matching at displacements 4 through 12 causing all nine string match state machines 363 to enter the string match state 387 at which point the global match signal GMAT 107 is asserted. With the bytes 15 through 22, progressively fewer string match state machines 363 continue to match. During this process the displacement indicated by the CAM increases from 4 to 12 as each new byte builds a string matching earlier in the data stream. The byte 23 ends the CAM match as we cannot have a displacement going past the beginning of the data stream. Note that while the bytes 21 and 22 match the line above and cause the scan line match signal SMAT 407 to go active, the match selection state machine 408 will continue reporting the CAM match until it terminates. The bytes 23 matches the line above (byte 3) and begins a scan line match that lasts through byte 29. The byte 30 matches nothing and hence is a raw byte. The bytes 31 and 32 match the scan line above and form a two byte scan match. The byte 33 is a raw byte. The byte 34 (00) matches both the line above and a previous byte stored within the CAM. Since the global match signal GMAT 107 will not go active until the second byte of a match while the scan match signal SMAT 407 goes active on the first, the match selection state machine 408 picks the scan line match which then runs for ten bytes. The bytes 44 through 47 match the bytes 33 through 36 forming a 4 byte CAM match (B,4). The bytes 48 through 50 do not match the line above or any of the 15 previous bytes and are therefore output as raw bytes. The bytes 51 and 52 match the line above forming a two byte scan line match (2). The byte 53 matches the byte 52 and the byte 54 matches the byte 53 forming a two byte CAM match with a displacement of two (2,2). The byte 55 does not match the line above or the last 15 bytes so it is output as a raw byte. The byte 56 matches the byte 48 and the byte 57 matches the byte 49 forming a two byte CAM match with a displacement of eight (8,2). The bytes 58 and 59 match both the bytes 48 and 49 as well as the bytes 56 and 57. The address logic module 365 always reports the match with the smallest displacement. Therefore, because the bytes 56 and 57 are closer, a CAM match of displacement two with length of two is output (2,2). The last byte matches the line above and is output as a one byte scan line match (1). The last symbol output by the postcode encoder 127 is an end of record marker which specifies that the data stream is complete.

As should be apparent to one skilled in the art, in order to decompress this compressed data stream, the compressed values and raw bytes are input to the decompressor, as illustrated in FIG. 5. The decompressor then reverses the above described process, outputting raw bytes and using the previous bytes of data to decompress the code pairs and scan line length of match values SLOM. When the decompression is complete, the original stream of data will be recovered.

As should be further apparent to those skilled in the art, the system of the present invention could include multiple previous scan line match locations, in addition to the one location included in the preferred embodiment. The sliding window compressor 103 could also be designed to include a larger or smaller CAM.

It will be readily apparent to one reasonably skilled in the art that other various modifications may be made to the preferred embodiment without departing from the spirit and scope of the invention as defined by the appended claims.

TABLE I

Encode B2 Format Definition

```
<compressed_data>  ::= <codeword>
                       <compressed_data><codeword>
<codeword>     :: = <scan_code>
                    <lz_code>
                    <raw_00_code>
                    <raw_ff_code>
                    <raw_byte_code>
                    <eor_code>
<scan_code>    ::= <scan_marker> <scan_lom>
<scan_marker>  ::= 10
<scan_lom>     ::=
```

| length | codeword | | | |
|---|---|---|---|---|
| 1   | 00          | 010         | 0110        | 0111        |
| 5   | 1000        | 1001        | 10100       | 101100      |
| 9   | 101101      | 101110      | 101111      | 110000      |
| 13  | 110001      | 1101000     | 1101001     | 1101010     |
| 17  | 1101011     | 1101100     | 1101101     | 1101110     |
| 21  | 1101111     | 11100000    | 11100001    | 11100010    |
| 25  | 11100011    | 11100100    | 11100101    | 11100110    |
| 29  | 11100111    | 111010000   | 111010001   | 111010010   |
| 33  | 111010011   | 111010100   | 111010101   | 111010110   |
| 37  | 111010111   | 111011000   | 111011001   | 111011010   |
| 41  | 111011011   | 111011100   | 111011101   | 111011110   |
| 45  | 111011111   | 1111000000  | 1111000001  | 1111000010  |
| 49  | 1111000011  | 1111000100  | 1111000101  | 1111000110  |
| 53  | 1111000111  | 1111001000  | 1111001001  | 1111001010  |
| 57  | 1111001011  | 1111001100  | 1111001101  | 1111001110  |
| 61  | 1111001111  | 11110100000 | 11110100001 | 11110100010 |
| 65  | 11110100011 | 11110100100 | 11110100101 | 11110100110 |
| 69  | 11110100111 | 11110101000 | 11110101001 | 11110101010 |
| 73  | 11110101011 | 11110101100 | 11110101101 | 11110101110 |
| 77  | 11110101111 | 11110110000 | 11110110001 | 11110110010 |
| 81  | 11110110011 | 11110110100 | 11110110101 | 11110110110 |
| 85  | 11110110111 | 11110111000 | 11110111001 | 11110111010 |
| 93  | 11110111111 | 111110000000 | 111110000001 | 111110000010 |
| 97  | 111110000011 | 111110000100 | 111110000101 | 111110000110 |
| 101 | 111110000111 | 111110001000 | 111110001001 | 111110001010 |
| 105 | 111110001011 | 111110001100 | 111110001101 | 111110001110 |
| 109 | 111110001111 | 111110010000 | 111110010001 | 111110010010 |
| 113 | 111110010011 | 111110010100 | 111110010101 | 111110010110 |
| 117 | 111110010111 | 111110011000 | 111110011001 | 111110011010 |
| 121 | 111110011011 | 111110011100 | 111110011101 | 111110011110 |
| 125 | 111110011111 | 111110100000 | 111110100001 | 111110100010 |
| 129 | 010111011111 | 100111011111 | 000111011111 | 110111011111 |
| 133 | 011011011111 | 101011011111 | 001011011111 | 110011011111 |
| 137 | 010011011111 | 100011011111 | 000011011111 | 111101011111 |
| 141 | 011101011111 | 101101011111 | 001101011111 | 110101011111 |
| 145 | 010101011111 | 100101011111 | 000101011111 | 111001011111 |
| 149 | 011001011111 | 101001011111 | 001001011111 | 110001011111 |
| 153 | 111110111011 | 111110111100 | 111110111101 | 111110111110 |
| 157 | 111110111111 | 111111000000 | 111111000001 | 111111000010 |
| 161 | 111111000011 | 111111000100 | 111111000101 | 111111000110 |
| 165 | 111111000111 | 111111001000 | 111111001001 | 111111001010 |
| 169 | 111111001011 | 111111001100 | 111111001101 | 111111001110 |
| 173 | 111111001111 | 111111010000 | 111111010001 | 111111010010 |
| 177 | 111111010011 | 111111010100 | 111111010101 | 111111010110 |
| 181 | 1111110101110 | 1111110101111 | 1111110110000 | 1111110110001 |
| 185 | 1111110110010 | 1111110110011 | 1111110110100 | 1111110110101 |
| 189 | 1111110110110 | 1111110110111 | 1111110111000 | 1111110111001 |
| 193 | 1111110111010 | 1111110111011 | 1111110111100 | 1111110111101 |
| 197 | 1111110111110 | 1111110111111 | 1111111000000 | 1111111000001 |

TABLE I-continued

| | | | | |
|---|---|---|---|---|
| 201 | 1111111000010 | 1111111000011 | 1111111000100 | 1111111000101 |
| 205 | 1111111000110 | 1111111000111 | 1111111001000 | 1111111001001 |
| 209 | 1111111001010 | 1111111001011 | 1111111001100 | 1111111001101 |
| 213 | 1111111001110 | 1111111001111 | 1111111010000 | 1111111010001 |
| 217 | 1111111010010 | 1111111010011 | 1111111010100 | 1111111010101 |
| 221 | 1111111010110 | 1111111010111 | 1111111011000 | 1111111011001 |
| 225 | 1111111011010 | 1111111011011 | 1111111011100 | 1111111011101 |
| 229 | 1111111011110 | 1111111011111 | 1111111100000 | 1111111100001 |
| 233 | 1111111100010 | 1111111100011 | 1111111100100 | 1111111100101 |
| 237 | 1111111100110 | 1111111100111 | 1111111101000 | 1111111101001 |
| 241 | 1111111101010 | 1111111101011 | 1111111101100 | 1111111101101 |
| 245 | 1111111101110 | 1111111101111 | 1111111110000 | 1111111110001 |
| 249 | 1111111110010 | 1111111110011 | 1111111110100 | 1111111110101 |
| 253 | 1111111110110 | 1111111110111 | 1111111111000 | 10101 |

<lz_code>   ::= <lz_marker> <lz_disp> <lz_lom>
<lz_marker>  ::= 11
<lz_disp>    ::=

| value | codeword |
|---|---|
| 1 | 00 |
| 2 | 010 |
| 3 | 011 |
| 4 | 100 |
| 5 | 101 |
| 6 | 110 |
| 7 | 11100 |
| 8 | 111010 |
| 9 | 111011 |
| 10 | 111100 |
| 11 | 111101 |
| 12 | 1111100 |
| 13 | 1111101 |
| 14 | 1111110 |
| 15 | 1111111 |

<lz_lom>  ::=

| length | codeword | | | |
|---|---|---|---|---|
| 1 | 00 | 010 | 0110 | |
| 5 | 0111 | 1000 | 1001 | 10100 |
| 9 | 101100 | 101101 | 101110 | 101111 |
| 13 | 110000 | 110001 | 1101000 | 1101001 |
| 17 | 1101010 | 1101011 | 1101100 | 1101101 |
| 21 | 1101110 | 1101111 | 11100000 | 11100001 |
| 25 | 11100010 | 11100011 | 11100100 | 11100101 |
| 29 | 11100110 | 11100111 | 111010000 | 111010001 |
| 33 | 111010010 | 111010011 | 111010100 | 111010101 |
| 37 | 111010110 | 111010111 | 111011000 | 111011001 |
| 41 | 111011010 | 111011011 | 111011100 | 111011101 |
| 45 | 111011110 | 111011111 | 1111000000 | 1111000001 |
| 49 | 1111000010 | 1111000011 | 1111000100 | 1111000101 |
| 53 | 1111000110 | 1111000111 | 1111001000 | 1111001001 |
| 57 | 1111001010 | 1111001011 | 1111001100 | 1111001101 |
| 61 | 1111001110 | 1111001111 | 11110100000 | 11110100001 |
| 65 | 11110100010 | 11110100011 | 11110100100 | 11110100101 |
| 69 | 11110100110 | 11110100111 | 11110101000 | 11110101001 |
| 73 | 11110101010 | 11110101011 | 11110101100 | 11110101101 |
| 77 | 11110101110 | 11110101111 | 11110110000 | 11110110001 |
| 81 | 11110110010 | 11110110011 | 11110110100 | 11110110101 |
| 85 | 11110110110 | 11110110111 | 11110111000 | 11110111001 |
| 89 | 11110111010 | 11110111011 | 11110111100 | 11110111101 |
| 93 | 11110111110 | 11110111111 | 111110000000 | 111110000001 |
| 97 | 111110000010 | 111110000011 | 111110000100 | 111110000101 |
| 101 | 111110000110 | 111110000111 | 111110001000 | 111110001001 |
| 105 | 111110001010 | 111110001011 | 111110001100 | 111110001101 |
| 109 | 111110001110 | 111110001111 | 111110010000 | 111110010001 |
| 113 | 111110010010 | 111110010011 | 111110010100 | 111110010101 |
| 117 | 111110010110 | 111110010111 | 111110011000 | 111110011001 |
| 121 | 111110011010 | 111110011011 | 111110011100 | 111110011101 |
| 125 | 111110011110 | 111110011111 | 111110100000 | 111110100001 |
| 129 | 111110100010 | 111110100011 | 111110100100 | 111110100101 |
| 133 | 111110100110 | 111110100111 | 111110101000 | 111110101001 |
| 137 | 111110101010 | 111110101011 | 111110101100 | 111110101101 |
| 141 | 111110101110 | 111110101111 | 111110110000 | 111110110001 |
| 145 | 111110110010 | 111110110011 | 111110110100 | 111110110101 |
| 149 | 111110110110 | 111110110111 | 111110111000 | 111110111001 |
| 153 | 111110111010 | 111110111011 | 111110111100 | 111110111101 |
| 157 | 111110111110 | 111110111111 | 111111000000 | 111111000001 |

TABLE I-continued

| | | | |
|---|---|---|---|
| 161 | 111111000010 | 111111000011 | 111111000100 | 111111000101 |
| 165 | 111111000110 | 111111000111 | 111111001000 | 111111001001 |
| 169 | 111111001010 | 111111001011 | 111111001100 | 111111001101 |
| 173 | 111111001110 | 111111001111 | 111111010000 | 111111010001 |
| 177 | 111111010010 | 111111010011 | 111111010100 | 111111010101 |
| 181 | 111111010110 | 1111110101110 | 1111110101111 | 1111110110000 |
| 185 | 1111110110001 | 1111110110010 | 1111110110011 | 1111110110100 |
| 189 | 1111110110101 | 1111110110110 | 1111110110111 | 1111110111000 |
| 193 | 1111110111001 | 1111110111010 | 1111110111011 | 1111110111100 |
| 197 | 1111110111101 | 1111110111110 | 1111110111111 | 111111000000 |
| 201 | 1111111000001 | 1111111000010 | 1111111000011 | 1111111000100 |
| 205 | 1111111000101 | 1111111000110 | 1111111000111 | 1111111001000 |
| 209 | 1111111001001 | 1111111001010 | 1111111001011 | 1111111001100 |
| 213 | 1111111001101 | 1111111001110 | 1111111001111 | 1111111010000 |
| 217 | 1111111010001 | 1111111010010 | 1111111010011 | 1111111010100 |
| 221 | 1111111010101 | 1111111010110 | 1111111010111 | 1111111011000 |
| 225 | 1111111011001 | 1111111011010 | 1111111011011 | 1111111011100 |
| 229 | 1111111011101 | 1111111011110 | 1111111011111 | 1111111100000 |
| 233 | 1111111100001 | 1111111100010 | 1111111100011 | 1111111100100 |
| 237 | 1111111100101 | 1111111100110 | 1111111100111 | 1111111101000 |
| 241 | 1111111101001 | 1111111101010 | 1111111101011 | 1111111101100 |
| 245 | 1111111101101 | 1111111101110 | 1111111101111 | 1111111110000 |
| 249 | 1111111110001 | 1111111110010 | 1111111110011 | 1111111110100 |
| 253 | 1111111110101 | 1111111110110 | 1111111110111 | 10101 |

```
<raw_00_code>     ::= <scan_marker> <raw_00_marker>
<raw_00_marker>   ::= 110010
<raw_ff_code>     ::= <scan_marker> <raw_ff_marker>
<raw_ff_marker>   ::= 110011
<raw_byte_code>   ::= <raw_marker> <raw_byte>
<raw_marker>      ::= 0
<raw_byte>        :: = 00000000 | 00000001 | 00000010 ..... | 11111110 | 11111111
<eor_code>        ::= <scan_marker> <eor_marker> <eor_pad>
<eor_marker>      ::= 1111111111001
<eor_pad>         ::=
                    | <bit>
                    | <bit> <eor_pad>
<bit>             ::= 0
                    | 1
```

We claim:

1. A data compression system comprising:
   a. means for sequentially receiving a stream of data symbols from an input source;
   b. means for implementing a sliding window with big gap data compressor coupled to the means for sequentially receiving, wherein a current input symbol is compared with a sliding window of symbols and one or more symbols received a first predetermined number of symbols prior to the current input symbol, wherein the sliding window of symbols includes a plurality of previously received continuous symbols and further wherein there is a second predetermined number of symbols between the sliding window and the one or more symbols.

2. The data compression system as claimed in claim 1 wherein the means for implementing comprises:
   a. a content addressable memory including a plurality of content addressable memory cells each capable of writing, searching and reading for storing the sliding window of symbols and comparing the current input symbol to the plurality of previously received continuous symbols within the sliding window of symbols; and
   b. a random access memory capable of storing at least a scan line of data symbols and outputting one or more previously received symbols stored at specific locations within the random access memory for storing the current input symbol and outputting one or more previously received symbols.

3. The data compression system as claimed in claim 2 wherein information indicative of a match is transferred between content addressable memory cells and symbols are not transferred between content addressable memory cells.

4. The data compression system as claimed in claim 2 wherein the content addressable memory outputs a CAM match signal when two or more adjacent input symbols match adjacent content addressable memory locations.

5. The data compression system as claimed in claim 4 further comprising a match select state machine coupled to the content addressable memory, to the random access memory and to receive the current input symbol for selecting between a match within the content addressable memory and a match between the current input symbol and one or more previously received symbols stored at specific locations.

6. The data compression system as claimed in claim 5 wherein the match select state machine will give precedence to a match within a content addressable memory of at least two symbols when a CAM match signal is activated and the current input symbol also matches one of the one or more previously received symbols stored at specific locations.

7. The data compression system as claimed in claim 6 further comprising means for decompressing previously compressed data.

8. The data compression system as claimed in claim 7 wherein the means for decompressing comprises a random access memory and a control logic circuit coupled to the random access memory for constructing the stream of data symbols from the previously compressed data.

9. The data compression system as claimed in claim 1 wherein a last symbol within the plurality of previously received continuous symbols is received immediately prior to the current input symbol.

10. A data compression system comprising:
   a. means for sequentially receiving a plurality of data symbols from an input source;
   b. means for simultaneously storing a present one of the symbols into one of a plurality of content addressable memory cells and comparing the present symbol to a plurality of previously received symbols to determine if the present symbol matches a previously received symbol, coupled to receive the plurality of data symbols for outputting a first output signal and specifying a CAM match when the present symbol matches one of the previously received symbols; and
   c. means for storing the present one of the symbols and comparing the present one of the symbols with one or more previously received symbols stored at exact programmable locations within the means for storing, coupled to sequentially receive the plurality of data symbols for outputting a second output signal and specifying an exact location match when the present symbol matches one of the one or more previously received symbols stored at an exact programmable location.

11. The data compression system as claimed in claim 10 wherein within the means for simultaneously storing state information indicative of a match is transferred between cells and symbols are not transferred between cells.

12. The data compression system as claimed in claim 10 further comprising means for selecting between a CAM match and an exact location match, coupled to the first output signal and the second output signal.

13. The data compression system as claimed in claim 12 wherein the means for selecting selects a CAM match when both a CAM match and an exact location match occur simultaneously.

14. The data compression system as claimed in claim 13 wherein the one or more previously received symbols and the plurality of previously received symbols are all within the stream of data symbols.

15. The data compression system as claimed in claim 14 further wherein the one or more previously received symbols are nonconsecutive with the plurality of previously received symbols within the stream of data symbols.

16. The data compression system as claimed in claim 12 wherein the plurality of content addressable memory cells include means for writing, searching and reading and collectively form a content addressable memory.

17. The data compression system as claimed in claim 16 wherein the plurality of content addressable memory cells include 16 content addressable memory cells.

18. The data compression system as claimed in claim 16 further comprising means for determining which longest matching string stored in the content addressable memory is nearest in location to the last byte stored in the content addressable memory, if there is more than one longest matching string stored in the content addressable memory.

19. The data compression system as claimed in claim 18 wherein the means for storing comprises a memory buffer capable of storing at least a scan line of data symbols.

20. The data compression system as claimed in claim 19 wherein the memory buffer is capable of storing 2048 data symbols.

21. The data compression system as claimed in claim 19 further comprising a plurality of string match state machines, each of the string match state machines cooperatively coupled to a stored byte of data in the content addressable memory.

22. The data compression system as claimed in claim 21 wherein each of the string match state machines comprise three states:
   a. a first state signalling that the stored data does not match the current input string;
   b. a second state signalling that the stored data matches only the last character of the current input string; and
   c. a third state signalling that the stored data matches at least the last two characters of the input string.

23. The data compression system as claimed in claim 22 wherein each of the string match state machines comprise a fourth state for initialization, wherein upon a reset signal all of the string match state machines are forced into the fourth state.

24. The data compression system as claimed in claim 1 wherein the means for simultaneously storing and comparing further comprises an array of a plurality of string match modules, each string match module comprising a CAM word, a string match state machine and an address logic module.

25. The data compression system as claimed in claim 24 wherein the array of a plurality of string match modules are arranged in a one-dimensional circular queue.

26. The data compression system as claimed in claim 25 further comprising means for decompressing previously compressed data.

27. A method for compressing an incoming stream of data symbols comprising the steps of:
   a. sequentially receiving a plurality of data symbols from an input source;
   b. simultaneously storing a present one of the symbols into one of a plurality of content addressable memory cells and comparing the present symbol to a plurality of previously received symbols to determine if the present symbol matches a previously received symbol;
   c. signalling a CAM match when the present symbol does match one of the previously received symbols within the content address memory cells;
   d. outputting a postcode value including a code pair representing a matching string of symbols within the content addressable memory when a CAM match is signalled on two consecutive input symbols;
   e. storing the present symbol and comparing the present symbol to one or more previously received symbols stored at specific programmable locations within the random access memory;
   f. signalling a scan line match when the present symbol does match one of the one or more previously received symbols stored at specific programmable locations;
   g. outputting a postcode value including a length of match value when a scan line match is signalled; and
   h. outputting a raw value including the present symbol when neither a CAM match or a scan line match are signalled.

28. The method as claimed in claim 27 further comprising the step of selecting a CAM match when both a CAM match and a scan line match are signalled simultaneously.

29. The method as claimed in claim 28 wherein the content addressable memory cells and the specific programmable locations within the random access memory are noncontiguous.

30. The method as claimed in claim 29 wherein the plurality of content addressable memory cells includes 16 content addressable memory cells.

31. The method as claimed in claim 30 wherein the random access memory stores 2048 data symbols.

32. The method as claimed in claim 29 further comprising the step of decompressing the compressed data and reconstructing the plurality of data symbols.

33. A data compression system for compressing an incoming stream of data and outputting postcode values representing the compressed data comprising:
   a. a sliding window compressor coupled to receive the incoming stream of data a symbol at a time for simultaneously storing a current symbol and comparing it to previously received symbols;
   b. a scan line buffer coupled to receive the incoming stream of data a symbol at a time for storing the current symbol and outputting one or more previously received symbols stored within the scan line buffer at specific programmable locations; and
   c. a match selection module coupled to the sliding window compressor and the scan line buffer for selecting between a match within the sliding window compressor and outputting a code pair representing a matching location and a length of match or a match within the scan line buffer and outputting a length of scan line match value, or if no match occurs outputting a raw byte including the current symbol.

34. The data compression system as claimed in claim 33 further comprising a postcode logic block coupled to the match selection module for encoding data output from the match selection module and outputting it to a storage or transmission system.

35. The data compression system as claimed in claim 33 wherein the sliding window compressor includes 16 content addressable memory cells.

36. The data compression system as claimed in claim 34 wherein the scan line buffer includes 2048 storage locations.

37. The data compression system as claimed in claim 35 wherein the match selection module selects a match within the sliding window compressor if both a match within the sliding window compressor and a match within the scan line buffer occur simultaneously.

38. The data compression system as claimed in claim 36 further comprising a decompressor logic circuit for decompressing previously compressed data and reconstructing the incoming stream of data.

* * * * *

UNITED STATES PATENT AND TRADEMARK OFFICE
CERTIFICATE OF CORRECTION

PATENT NO. : 5,694,125
DATED      : December 2, 1997
INVENTOR(S): Owsley, et al

Page 1 of 4

It is certified that error appears in the above-identified patent and that said Letters Patent is hereby corrected as shown below:

On the title page, item [73]
IN THE ASSIGNEE:

Delete "Advance Hardware Architecture" and insert --Advanced Hardware Architectures--.

under item [56],
IN THE REFERENCES CITED:

Delete "5,565,383" and insert --5,563,833--.

In column 4, lines 16 and 17, delete "U.S. Ser. No. 05/532,693," and insert --U.S. Patent Number 5,532,693, issued on July 2, 1996--.

In column 14, Table 1, delete
"<compressed_data> : :   =    <codeword>
                               <compressed_data>   <codeword>

<codeword> : :   =    <scan_code>
                       <lz_code>
                       <raw_00_code>
                       <raw_ff_code>
                       <raw_byte_code>
                       <eor_code>"

UNITED STATES PATENT AND TRADEMARK OFFICE
CERTIFICATE OF CORRECTION

PATENT NO. : 5,694,125         Page 2 of 4
DATED : December 2, 1997
INVENTOR(S) : Owsley, et al It is certified that error appears in the above-identified patent and that said Letters Patent is hereby corrected as shown below:

and insert

--<compressed_data> : : =    <codeword>
                                  |    <compressed_data>  <codeword>

<codeword> : : =    <scan_code>
                       |    <lz_code>
                       |    <raw_00_code>
                       |    <raw_ff_code>
                       |    <raw_byte_code>
                       |    <eor_code>--

In column 14, Table 1 insert

--89   11110111011   11110111100   11110111101   11110111110--

UNITED STATES PATENT AND TRADEMARK OFFICE
CERTIFICATE OF CORRECTION

PATENT NO. : 5,694,125        Page 3 of 4
DATED      : December 2, 1997
INVENTOR(S): Owsley, et al It is certified that error appears in the above-identified patent and that said Letters Patent is hereby corrected as shown below:

In column 14, Table 1, delete

"129  010111011111   100111011111   000111011111   111011011111
 133  011011011111   101011011111   001011011111   110011011111
 137  010011011111   100011011111   000011011111   111101011111
 141  011101011111   101101011111   001101011111   110101011111
 145  010101011111   100101011111   000101011111   111001011111
 149  011001011111   101001011111   001001011111   110001011111"

and insert

--129  111110100011   111110100100   111110100101   111110100110
  133  111110100111   111110101000   111110101001   111110101010
  137  111110101011   111110101100   111110101101   111110101110
  141  111110101111   111110110000   111110110001   111110110010
  145  111110110011   111110110100   111110110101   111110110110
  149  111110110111   111110111000   111110111001   111110111010--

UNITED STATES PATENT AND TRADEMARK OFFICE
CERTIFICATE OF CORRECTION

PATENT NO. : 5,694,125
DATED : December 2, 1997
INVENTOR(S) : Owsley, et al

It is certified that error appears in the above-identified patent and that said Letters Patent is hereby corrected as shown below:

IN THE CLAIMS:

In column 22, line 6, delete "as claimed in claim 33" and insert --as claimed in claim 34--

In column 22, line 9, delete "as claimed in claim 34" and insert --as claimed in claim 35--

In column 22, line 11, delete "as claimed in claim 35" and insert --as claimed in claim 36--

In column 22, line 16 "as claimed in claim 36" and insert --as claimed in claim 37--

Signed and Sealed this

Third Day of March, 1998

Attest:

BRUCE LEHMAN

Attesting Officer

Commissioner of Patents and Trademarks